United States Patent
Wuister et al.

(10) Patent No.: US 9,368,366 B2
(45) Date of Patent: Jun. 14, 2016

(54) METHODS FOR PROVIDING SPACED LITHOGRAPHY FEATURES ON A SUBSTRATE BY SELF-ASSEMBLY OF BLOCK COPOLYMERS

(71) Applicant: ASML Netherlands B.V., Veldhoven (NL)

(72) Inventors: Sander Frederik Wuister, Eindhoven (NL); Tamara Druzhinina, Eindhoven (NL); Mircea Dusa, Campbell, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/764,133

(22) PCT Filed: Jan. 24, 2014

(86) PCT No.: PCT/EP2014/051451
§ 371 (c)(1),
(2) Date: Jul. 28, 2015

(87) PCT Pub. No.: WO2014/124795
PCT Pub. Date: Aug. 21, 2014

(65) Prior Publication Data
US 2015/0364335 A1     Dec. 17, 2015

Related U.S. Application Data

(60) Provisional application No. 61/764,881, filed on Feb. 14, 2013.

(51) Int. Cl.
*H01L 21/30*     (2006.01)
*H01L 21/308*    (2006.01)
(Continued)

(52) U.S. Cl.
CPC ............. *H01L 21/3086* (2013.01); *B82Y 10/00* (2013.01); *G03F 1/50* (2013.01);
(Continued)

(58) Field of Classification Search
None
See application file for complete search history.

(56) References Cited

U.S. PATENT DOCUMENTS 8,097,175 B2   1/2012   Millward et al.
8,147,914 B2   4/2012   Jung et al.
(Continued)

FOREIGN PATENT DOCUMENTS

WO   2009/134635   11/2009

OTHER PUBLICATIONS

International Search Report mailed Jul. 17, 2014 in corresponding International Patent Application No. PCT/EP2014/051451.
(Continued)

*Primary Examiner* — Evren Seven
(74) *Attorney, Agent, or Firm* — Pillsbury Winthrop Shaw Pittman LLP

(57) ABSTRACT

A method of forming a plurality of regularly spaced lithography features, the method including providing a self-assemblable block copolymer having first and second blocks in a plurality of trenches on a substrate, each trench including opposing side-walls and a base, with the side-walls having a width therebetween, wherein a first trench has a greater width than a second trench; causing the self-assemblable block copolymer to self-assemble into an ordered layer in each trench, the layer having a first domain of the first block alternating with a second domain of the second block, wherein the first and second trenches have the same number of each respective domain; and selectively removing the first domain to form regularly spaced rows of lithography features having the second domain along each trench, wherein the pitch of the features in the first trench is greater than the pitch of the features in the second trench.

17 Claims, 5 Drawing Sheets

(51) Int. Cl.
  *G03F 7/00* (2006.01)
  *H01L 21/027* (2006.01)
  *H01L 21/033* (2006.01)
  *H01L 29/66* (2006.01)
  *H01L 29/775* (2006.01)
  *H01L 29/06* (2006.01)
  *B82Y 10/00* (2011.01)
  *G03F 1/50* (2012.01)
  *G03F 1/80* (2012.01)
  *H01L 29/78* (2006.01)

(52) U.S. Cl.
  CPC .............. *G03F 1/80* (2013.01); *G03F 7/0002* (2013.01); *H01L 21/0271* (2013.01); *H01L 21/0337* (2013.01); *H01L 29/0673* (2013.01); *H01L 29/66439* (2013.01); *H01L 29/66795* (2013.01); *H01L 29/775* (2013.01); *H01L 29/785* (2013.01)

(56) References Cited

U.S. PATENT DOCUMENTS

| | | | | |
|---|---|---|---|---|
| 8,828,253 | B2* | 9/2014 | Koole | B81C 1/00031 216/38 |
| 9,107,291 | B2* | 8/2015 | Cheng | G03F 7/0002 |
| 9,250,528 | B2* | 2/2016 | Wuister | G03F 7/20 |
| 2008/0176767 | A1* | 7/2008 | Millward | B81C 1/00031 506/20 |
| 2008/0315309 | A1 | 12/2008 | Chang et al. | |
| 2009/0026543 | A1* | 1/2009 | Yang | H01L 21/845 257/365 |
| 2009/0240001 | A1* | 9/2009 | Regner | B05D 1/34 525/95 |
| 2011/0059299 | A1* | 3/2011 | Kim | B81C 1/00031 428/195.1 |
| 2012/0067843 | A1 | 3/2012 | Watanabe et al. | |
| 2012/0107583 | A1 | 5/2012 | Xiao et al. | |
| 2012/0116007 | A1 | 5/2012 | Gopalan et al. | |
| 2012/0196094 | A1 | 8/2012 | Xu et al. | |
| 2012/0312501 | A1* | 12/2012 | Koole | B82Y 10/00 165/65 |
| 2013/0034811 | A1* | 2/2013 | Peeters | B82Y 10/00 430/270.1 |
| 2013/0078574 | A1* | 3/2013 | Peeters | G03F 7/0002 430/285.1 |
| 2014/0148012 | A1* | 5/2014 | Guillorn | B81C 1/00031 438/700 |
| 2014/0363072 | A1* | 12/2014 | Van Heesch | G06F 17/5045 382/141 |
| 2015/0010869 | A1* | 1/2015 | Peeters | G03F 7/038 430/322 |
| 2015/0380252 | A1* | 12/2015 | Xu | H01L 21/32139 438/703 |

OTHER PUBLICATIONS

Nabil Laachi et al., "Self-Consistent Field Theory of Directed Self-Assembly in Laterally Confined Lamellae-Forming Diblock Copolymers," Proc. of SPIE, vol. 8323, pp. 83230K-1-83230K-7 (2012).

Yeon Sik Jung, "Templated self-assembly of siloxane block copolymers for nanofabrication," Department of Materials Science and Engineering, Massachusetts Institute of Technology, pp. 1-171 (Jun. 2009).

C.T. Black, "Self-aligned self assembly of multi-nanowire silicon field effect transistors," Appl. Phys. Lett., vol. 87, pp. 163116-1-163116-3 (2005).

Joy Y. Cheng et al., "Self-Assembled One-Dimensional Nanostructure Arrays," Nano Letters, vol. 6, No. 9, pp. 2099-2103 (2006).

Toru Yamaguchi et al., "Resist-Pattern Guided Self-assembly of Symmetric Diblock Copolymer," J. PhotoPolym. Sci. Technol., vol. 19, No. 3, pp. 385-388 (2006).

Miri Park et al., "Block Copolymer Lithography: Periodic Arrays of ~$10^{11}$ Holes in 1 Square Centimeter," Science, vol. 276, pp. 1401-1404 (May 30, 1997).

* cited by examiner

| (a) | (b) | (c) |
|-----|-----|-----|
| (b) | (c) | (a) |
| (c) | (a) | (b) |

METHODS FOR PROVIDING SPACED LITHOGRAPHY FEATURES ON A SUBSTRATE BY SELF-ASSEMBLY OF BLOCK COPOLYMERS

CROSS-REFERENCE TO RELATED APPLICATIONS

This application is the U.S. national phase entry of PCT patent application no. PCT/EP2014/051451, which was filed on Jan. 24, 2014, which claims the benefit of priority of U.S. provisional patent application No. 61/764,881, which was filed on Feb. 14, 2013 and which is incorporated herein in its entirety by reference.

FIELD

The present invention relates to a method of forming regularly spaced lithography features on a substrate, by use of self-assembly of block copolymer in a trench provided on the substrate. The method may be useful for forming one or more transistor conducting channels of a field effect transistor.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In projection photolithography, the push for smaller features has resulted in the development of technologies such as immersion lithography and extreme ultraviolet (EUV) lithography.

As an alternative, so-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both projection photolithography and for imprint lithography, it is desirable to provide high resolution patterning of surfaces, for example of an imprint template or of other substrates. The use of self-assembly of a block copolymers (BCP) has been considered as a potential method for increasing the feature resolution to a smaller dimension than that obtainable by prior lithography methods or as an alternative to electron beam lithography for preparation of imprint templates.

A self-assemblable BCP is a compound useful in nanofabrication because it may undergo an order-disorder transition on cooling below a certain temperature (order-disorder transition temperature To/d) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have a line width roughness of the order of about 1-5 nm and may be manipulated by modification of the chemical compositions of the blocks of the copolymer.

The feasibility of using a thin film of BCP as a self-assembling template was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A BCP comprises different blocks, each typically comprising one or more identical monomers, and arranged side-by-side along the polymer chain. Each block may contain many monomers of its respective type. So, for instance, an A-B BCP may have a plurality of type A monomers in the (or each) A block and a plurality of type B monomers in the (or each) B block. An example of a suitable BCP is, for instance, a polymer having covalently linked blocks of polystyrene (PS) monomer (hydrophobic block) and polymethylmethacrylate (PMMA) monomer (hydrophilic block). Other BCPs with blocks of differing hydrophobicity/hydrophilicity may be useful. For instance a tri-block copolymer such as (A-B-C) BCP may be useful, as may an alternating or periodic BCP e.g. $[-A-B-A-B-A-B]_n$ or $[-A-B-C-A-B-C]_m$ where n and m are integers. The blocks may be connected to each other by covalent links in a linear or branched fashion (e.g., a star or branched configuration).

A BCP may form many different phases upon self-assembly, dependent upon the volume fractions of the blocks, degree of polymerization within each block type (i.e. number of monomers of each respective type within each respective block), the optional use of a solvent and surface interactions. When applied in a thin film, geometric confinement may pose additional boundary conditions that may limit the phases formed. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled BCPs.

The phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At a 50:50 ratio, a lamellar phase is formed. With a ratio of 30:70 an inverted cylindrical phase may be formed and at a ratio of 20:80, an inverted cubic phase may be formed.

Suitable BCPs for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetra-block or other multi-block copolymer.

One method used to guide or direct self-assembly of a polymer (such as a BCP) onto a substrate surface is known as graphoepitaxy. This method involves the self-organization of a BCP guided by topological pre-patterning on the substrate using one or more features constructed of resist (or one or more features transferred from resist onto a substrate surface, or one or more features transferred onto a film stack deposited on the substrate surface). The pre-patterning is used to form an enclosure or "trench" comprising a substrate base and a sidewall, e.g., a pair of opposing side-walls, of resist (or a side-wall formed in a film or a side-wall formed in the substrate).

Typically, the height of a feature of a graphoepitaxy template is of the order of the thickness of the BCP layer to be ordered, so may be, for instance, from about 20 nm to about 150 nm.

A lamellar self-assembled BCP can form a parallel linear pattern of lithography features with adjacent lines of the different polymer block domains in the trenches. For instance if the BCP is a di-block copolymer with A and B blocks within the polymer chain, the BCP may self-assemble into an ordered layer in each trench, the layer comprising regularly spaced first domains of A blocks, alternating with second domains of B blocks.

Similarly, a cylindrical self-assembled BCP can form an ordered pattern of lithography features comprising regularly spaced parallel lines of cylindrical discontinuous first domains surrounded by a second continuous domain. For instance, if the BCP is a di-block copolymer with A and B blocks within the polymer chain, the A blocks may assemble into cylindrical discontinuous domains regularly spaced across the trench and surrounded by a continuous domain of B blocks.

Graphoepitaxy may be used, therefore, to guide the self-organization of lamellar or cylindrical phases such that the BCP pattern subdivides the spacing of the side wall(s) into domains of alternating copolymer patterns.

In a process to implement the use of BCP self-assembly in nanofabrication, a substrate may be modified with a neutral orientation control layer, as part of the graphoepitaxy template, to induce the preferred orientation of the self-assembly pattern in relation to the substrate. For some BCPs used in self-assemblable polymer layers, there may be a preferential interaction between one of the blocks and the substrate surface that may result in orientation. For instance, for a polystyrene(PS)-b-PMMA BCP, the PMMA block will preferentially wet (i.e. have a high chemical affinity with) an oxide surface and this may be used to induce the self-assembled pattern to lie oriented substantially parallel to the plane of the surface. Substantially normal orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "normal orientation" it is meant that the domains of each block will be positioned side-by-side at the substrate surface, with the interfacial regions between adjacent domains of different blocks lying substantially perpendicular to the plane of the surface.

In a graphoepitaxy template for aligning a di-block copolymer having A and B blocks, where A is hydrophilic and B is hydrophobic in nature, the graphoepitaxy pattern may comprise hydrophobic resist side-wall features, with a neutral orientation base between the hydrophobic resist features. The B domain may preferentially assemble alongside the hydrophobic resist features, with several alternating domains of A and B blocks aligned over the neutral orientation region between the pinning resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to about 40 nm, or less than or equal to about 20 nm.

A thin layer of self-assemblable BCP may be deposited onto a substrate having a graphoepitaxy template as set out above. A suitable method for deposition of the self-assemblable polymer is spin-coating, as this process is capable of providing a well-defined, uniform, thin layer of self-assemblable polymer. A suitable layer thickness for a deposited self-assemblable polymer film is approximately 10 nm to 150 nm.

Following deposition of the BCP film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a BCP is a process where the assembly of many small components (the BCP) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B BCP, with the driving force for phase separation described by Flory-Huggins theory for the system under consideration. The use of graphoepitaxy may greatly reduce defect formation.

For a polymer which undergoes self-assembly, the self-assemblable polymer will exhibit an order-disorder temperature $T_{o/d}$. $T_{o/d}$ may be measured by any suitable technique for assessing the ordered/disordered state of the polymer, such as differential scanning calorimetry (DSC). If layer formation takes place below this temperature, the molecules will be driven to self-assemble. Above the temperature $T_{o/d}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature $T_{o/d}$ for the polymer.

Ordering and defect annihilation may be combined into a single annealing process or a plurality of processes may be used in order to provide a layer of self-assembled polymer such as BCP, having an ordered pattern of domains of differing chemical type (of domains of different block types).

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the features of the second domain type. A pattern having parallel cylindrical phase domains can be etched using a dry etching or reactive ion etching technique. A pattern having lamellar phase domains can utilize a wet etching technique in addition to or as an alternative to those suitable for the etching of parallel cylindrical phase domains.

Following the breakthrough etching, the pattern may be transferred by so-called transfer etching using an etching means which is resisted by the second domain type and so forms recesses in the substrate surface where the surface has been laid bare.

SUMMARY

Spacing between lithography features is known as pitch—defined as the width of one repeat unit of the lithography feature (i.e. feature width plus inter-feature spacing). A self-assembly process using a BCP can be used to produce lithography features with particularly low pitch, typically less than 30-50 nm.

It would be useful, for example, to be able to construct, using one processing step, multiple sets of lithography features, wherein the lithography features of one set are of different pitch to the lithography features of another set. Current methods involve multiple processing steps (methods such as "pitch division" and "multi-patterning split" all involve multiple processing steps).

It is an object of an embodiment of the invention to, for example, obviate or mitigate one or more disadvantages described herein, or one or more other disadvantages associated with the art.

According to an embodiment, there is provided a method of forming a plurality of regularly spaced lithography features, the method comprising:

providing a plurality of trenches on a substrate, each trench comprising opposing side-walls and a base, with the side-walls having a width therebetween, wherein a first trench has a greater width than a second trench;

providing a self-assemblable block copolymer having first and second blocks in the plurality of trenches;

causing the self-assemblable block copolymer to self-assemble into an ordered layer in each trench, the layer comprising a first domain of the first block alternating with a second domain of the second block, wherein the first and second trenches have the same number of each respective domain; and selectively removing the first domain to form regularly spaced rows of lithography features comprised of the second domain along each trench, wherein the pitch of the features in the first trench is greater than the pitch of the features in the second trench.

The substrate may have trenches of varying widths. For any given trench width, a number of domains of block copolymer (BCP) may be formed, with BCPs of different types preferentially adopting certain numbers of domains. Broadly speaking, larger trenches will lead to the formation of ordered layers having larger numbers of domains than will smaller trenches. Thus the number of domains can be said to follow a linear relationship with trench size (for a given BCP).

It has been unexpectedly found that, in addition to the linear relationship of number of domains with trench size, relatively small increases in trench width (which are not large enough to increase the number of domains formed) lead to the formation of domains of greater pitch (i.e. the pitch is stretched). Still further increases in trench width may then be sufficient to cause the number of domains formed to increase at which point the pitch of each domain returns to an unstretched state, i.e. the pitch decreases to accommodate the additional domain. By appropriate selection of the trench width it is, therefore, possible to produce an ordered layer of self-assembled BCP having a certain number of domains and domain pitch in each trench. Additionally, since ordered layers of different pitches of domains may be produced using a single type of BCP, it is possible to produce, in one step, a substrate having multiple trenches of lithography features, wherein the lithography features of different trenches are of differing pitch. Furthermore, by appropriate consideration of trench width and choice of BCP, it is possible to consistently produce such trenches having a certain number of lithography features of specific pitches.

The following features are applicable to each aspect of the invention where appropriate. When suitable, combinations of the following features may be employed as part of the invention, for instance as set out in the claims. The invention is particularly suitable for use in device lithography. For instance, the invention may be of use in patterning a substrate which is used directly to form a device, or may be of use in patterning an imprint template for use in imprint lithography (which may then be used to form devices).

Four or more trenches may be provided, the third and fourth trenches having the same number of each respective domain, and the second and third trenches having different numbers of each respective domain.

The third trench may have a greater width than the fourth trench.

The lithography features may have a pitch of down to around 20 nm, and may have a pitch of down to around 10 nm. The lithography features may have a pitch of up to around 40 nm.

The substrate may be a semiconductor substrate, and may comprise a plurality of layers forming the substrate. For instance, the outermost layer of the substrate may be an ARC (anti-reflection coating) layer.

The outermost layer of the substrate may be neutral to the domains of the BCP, by which it is meant that it has a similar chemical affinity for each of the domain types of the BCP. The neutral orientation layer may, for example, be created by use of random copolymer brushes. Alternatively, an orientation control layer may be provided as an uppermost or outermost surface layer of the substrate to induce a desired orientation of the self-assembly pattern in relation to the substrate.

The trench comprising opposing side-walls may be formed by photolithography, for instance with actinic radiation such as UV, EUV or DUV (deep UV) radiation. The trench may, for example, be formed in resist. The trench may, for example, be formed on a substrate surface (e.g. having been transferred from resist onto the substrate). The trench may, for example, be formed in a film stack (e.g. having been transferred from resist onto the film stack).

The height of the trench may be of the order of the thickness of the BCP layer to be ordered. The height of the trench may, for example, be from about 20 nm to about 150 nm (e.g. about 100 nm). The trench may have a width of about 200 nm or less.

In order to direct self assembly and reduce defects, the side-walls may have a higher chemical affinity for one of the block of the BCP such that, upon assembly, the block having the higher chemical affinity with the side-wall is caused to assemble alongside that side-wall. Chemical affinity may be provided by utilizing hydrophobic or hydrophilic side-wall features.

Providing a layer of self-assemblable BCP in the trench may be carried out by spin coating of a solution of the BCP followed by removal of solvent.

The self-assemblable BCP may be caused to self-assemble by lowering the temperature to a temperature less than To/d for the BCP, to give an ordered layer of self-assembled BCP in the trench.

The BCP may be adapted to form an ordered layer comprising a row of one or more first domains of the first block, self-assembled side-by-side in the slot, alternating with one or more second domains of the second block. The method may involve the self-assemblable BCP being adapted to form an ordered layer having first, discontinuous domains of the first block in a cylindrical array alternating with a second continuous domain of the second block therebetween, the domains being oriented substantially parallel to the substrate and substantially parallel to the side-walls. In another suitable arrangement, the BCP may be adapted to form an ordered layer which is a lamellar ordered layer, wherein first domains are lamellae alternating with second domains which are also lamellae, the lamellae of the first and second domains oriented with their planar surfaces lying substantially perpendicular to the substrate and substantially parallel to the side-walls. Cylindrical arrays are able to cover a wider range of pitches than lamellar phases.

Selectively removing one of the domains may be, for example, achieved by etching, wherein the ordered layer of self-assembled BCP acts as a resist layer for etching a row of regularly spaced lithography features along the trench on the substrate. Selective etching can be achieved by utilizing polymers having different etch resist properties and by selection of an etchant capable of selectively etching one or more of the polymer domains. Selective removal may be achieved, for instance, by selective photo-degradation or photo-cleavage of a linking agent between blocks of the copolymer and subsequent solubilization of one of the blocks.

An embodiment of the present invention relates to a lithography method. The method may be used in a process for the manufacture of a device, such as an electronic device or integrated circuit, or other applications, such as the manufacture of an integrated optical system, a guidance and detection pattern for a magnetic domain memory, a flat-panel display, a liquid-crystal display (LCD), a thin film magnetic head, an organic light emitting diode, etc. An embodiment of the invention is of use to create a regular nanostructure on a surface for use in the fabrication of an integrated circuit, bit-patterned media and/or discrete track media for a magnetic storage device (e.g. for a hard drive).

An embodiment of the invention is useful in the fabrication of a field effect transistor (FET), and more particularly useful in the fabrication of a FinFET. A FinFET is a specific type of FET in which one or more tall and thin conducting channels (resembling a fin and defining a pathway between a transistor source and drain) are wrapped by a gate capable of modulating channel conductivity by application of a voltage. FinFET channels should have consistent pitch, since channel pitch affects the gate voltage required in order to allow electron flow through a conducting channel of a transistor (this voltage is known as the threshold voltage, $V_{TH}$). Low pitch, low threshold voltage FinFETs are useful in fast/low-power applications, while high pitch, high threshold voltage FinFETs are useful in applications in which low electron leakage is desired. Typically a single device includes both high and low threshold voltage FinFETs.

The regularly spaced lithography features which can be produced using a method described herein are suited to use as conducting channels for FinFET applications. As mentioned above, the method is capable of producing multiple trenches having lithography features of differing pitches on the same substrate. When applying this method to FinFET construction, this allows for the formation, on a single substrate, of multiple FinFETs in which the channel pitch of one FinFET can be made to be different to that of another FinFET. Channels with different pitches may be made in a single step. Accordingly, and by appropriate selection of trench width, a method described herein is useful for construction of devices having multiple FinFETs, wherein some of the FinFETs have a low threshold voltage (i.e. are capable of performing fast/low-power applications) while others have a high threshold voltage (i.e. are capable of applications requiring low electron leakage).

The self-assemblable BCP may be a BCP as set out hereinbefore comprising at least two different block types, referred to as first and second polymer blocks, which are self-assemblable into an ordered polymer layer having the different block types associated into first and second domain types. The BCP may comprise a di-block copolymer, a tri-block and/or a multi-block copolymer. Alternating or periodic BCPs may also be used in the self-assemblable BCP.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity. Chemical affinities of surfaces may be measured, for instance, by means of contact angle measurements using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis substantially normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

In this specification, the term "substrate" is meant to include any surface layer forming part of the substrate, or being provided on a substrate, such as one or more planarization layers or anti-reflection coating layers which may be at, or form, the surface of the substrate, or may include one or more other layers such as those specifically mentioned herein.

BRIEF DESCRIPTION OF THE DRAWINGS

Specific embodiments of the invention will be described with reference to the accompanying Figures, in which.

DETAILED DESCRIPTION

The described and illustrated embodiments are to be considered as illustrative and not restrictive in character, it being understood that only preferred embodiments have been shown and/or described and that all changes and modifications that come within the scope of the inventions as defined in the claims are desired to be protected.

Figure 1A:
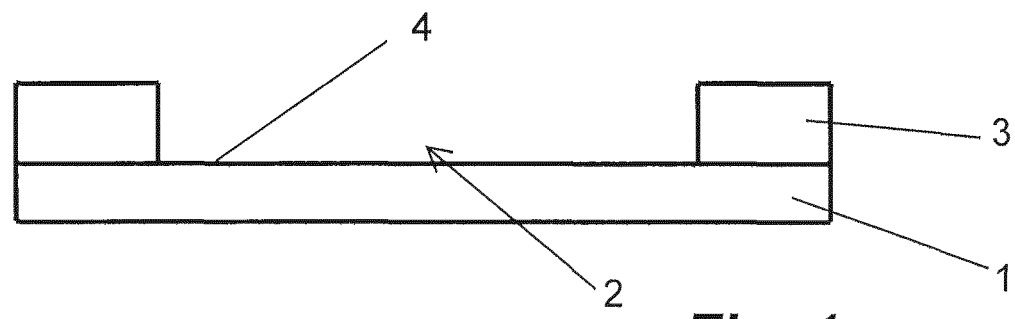
FIGS. 1A-1C schematically depicts directed self-assembly of A-B block copolymer onto a substrate by graphoepitaxy and formation of regularly spaced lithography features by selective etching of one domain.
Figure 1B:
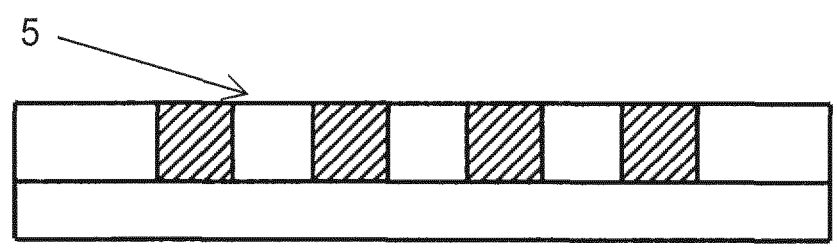
Figure 1C:
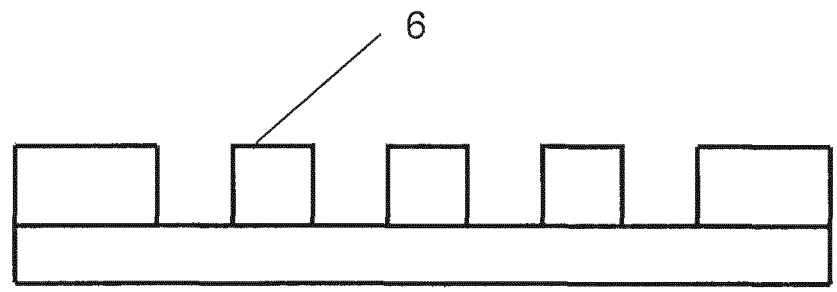

FIG. 1A shows a substrate 1 with a trench 2 formed thereon bounded by one or more side-walls 3 and a bottom surface 4. In FIG. 1B, a self-assemblable A-B block copolymer with hydrophilic A (hatched) and hydrophobic B (unhatched) blocks has been deposited into the trench to form a layer 5 with alternating stripes of A and B domains which have deposited as a lamellar phase separated into discrete micro-separated periodic domains during deposition of the BCP. In FIG. 1C, the type A domains have been removed by selective removal, leaving the type B domains as a number of regularly spaced rows of lithography features 6.

Selective removal may be achieved, for example, by chemical etching, which may be achieved due the relative susceptibility towards etching, with the A block being relatively prone to etching, while the B block is relatively resistant to etching. Selective removal may be achieved, for instance, by selective photo-degradation or photo-cleavage of a linking agent between blocks of the copolymer and subsequent solubilization of one of the blocks. An embodiment allows for formation, onto a substrate, of rows of regularly spaced lithography features, positioned side-by side along a substrate, using a self-assembled BCP to provide features which are hence closely spaced and small in size.

In an embodiment (not illustrated), the etching (or other removal process) may etch into the substrate 1. Following this the type B domain may be removed, leaving behind regularly spaced rows of lithography features formed in the substrate.

In a modification to the embodiment shown, one or more side-walls of the trench may have a higher chemical affinity for one of the blocks of the BCP. For example in a trench for aligning a di-block copolymer having A and B blocks, where A is hydrophobic and B is hydrophilic in nature, the trench may comprise hydrophobic resist side-wall features, with a neutral orientation base therebetween. The A domain may preferentially assemble alongside the hydrophobic resist features, with several alternating domains of A and B blocks aligned over the neutral orientation base between the resist features of the trench.

Figure 2A:
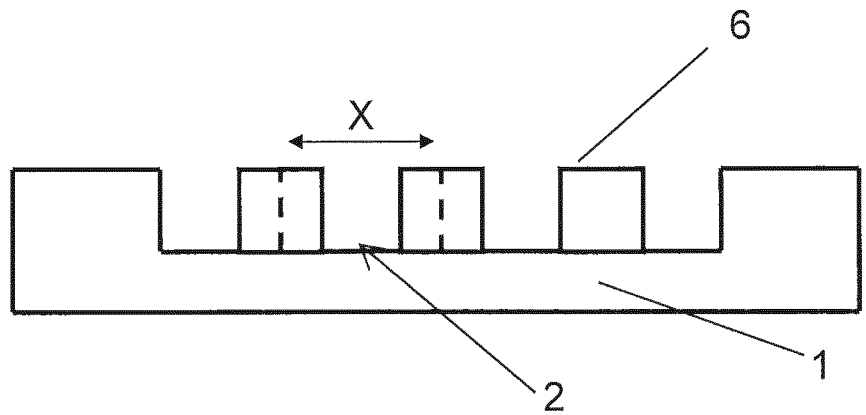
FIGS. 2A-2C schematically depicts an increase in domain pitch achievable by increasing trench width in accordance with an embodiment of the invention.
Figure 2B:
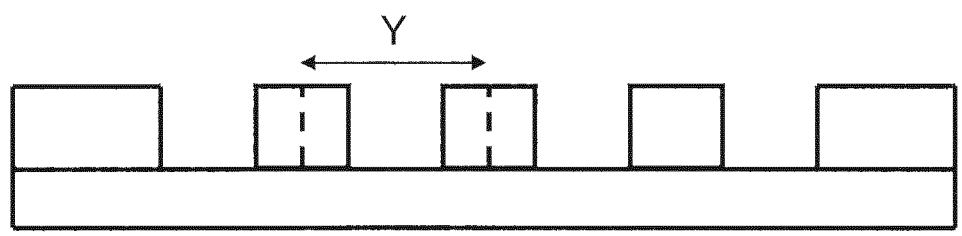
Figure 2C:
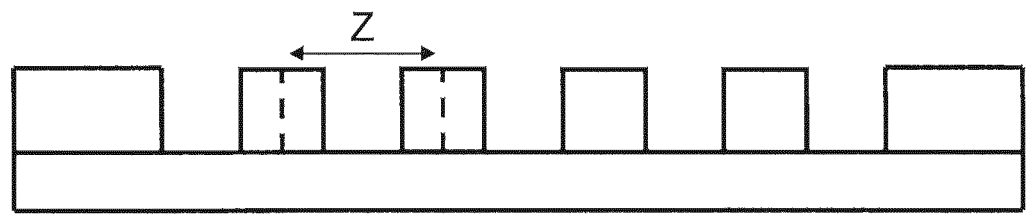

FIG. 2A shows a substrate 1 upon which rows of regularly spaced lithography features 6 have been positioned using a self-assembled BCP. Three rows of lithography features have been formed in a trench 2, each feature having a certain pitch denoted by "X". As mentioned above, pitch is defined as the width of one repeat unit of the lithography feature, as represented on the diagram by the dashed lines down the center of the two leftmost features. In FIG. 2B, the width of the trench has been increased slightly, such that the number of rows of features formed is the same but such that the pitch of each feature (denoted by "Y") has been increased with respect to the pitch of the features in FIG. 2A. In FIG. 2C the width of the trench has been expanded further, here the number of rows of features formed has increased to four, while the pitch of each feature (denoted by "Z") has reduced to a value similar to that of FIG. 2A (i.e. Z is approximately equal to X).

Figure 3A:
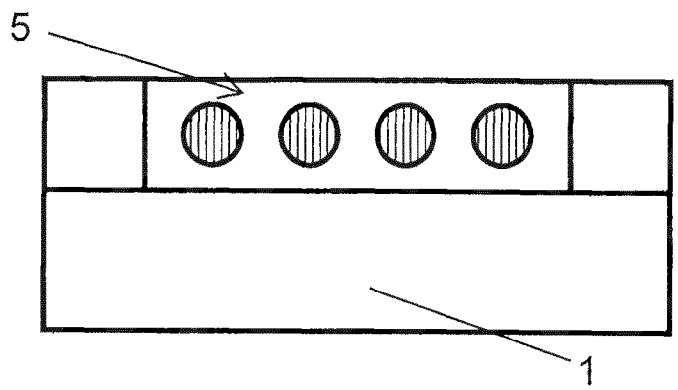
FIGS. 3A-3C schematically depicts directed self-assembly of A-B block copolymer onto a substrate by graphoepitaxy, the increase in domain pitch achievable by increasing trench width, and formation of regularly spaced lithography features by selective etching of one domain.
Figure 3B:
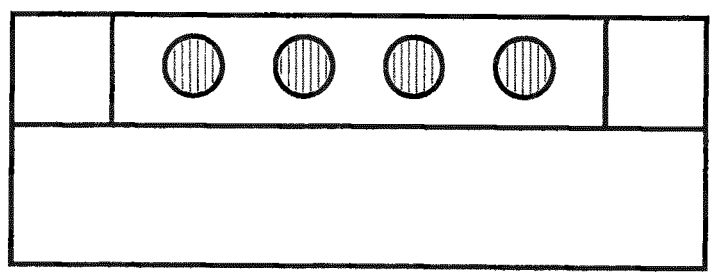
Figure 3C:
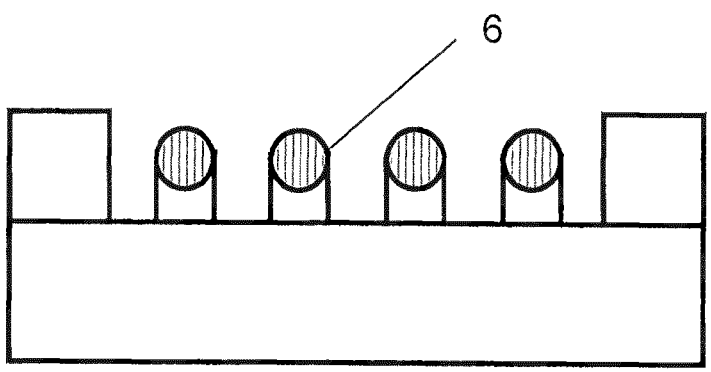

FIG. 3 shows a substrate 1 upon which rows of regularly spaced lithography features 6 have been positioned using a self-assembled BCP in a similar manner to FIG. 1. In FIG. 3 cylindrical domains are formed instead of the lamellar domains of FIG. 1. A self-assemblable A-B block copolymer with A (hatched) and B (unhatched) blocks is deposited into the trench to form a layer 5. As shown in FIG. 3B, the width of the trench has been increased slightly, such that the number of rows of features formed is the same but such that the pitch of each feature has been increased with respect to the pitch of the features in FIG. 3A (in the same way as shown with lamellar domains in FIG. 2). In FIG. 3C, the type B domain of FIG. 3B have been removed by selective etching, leaving the type A domains as a number of regularly spaced rows of lithography features 6. Small portions of B domain located directly beneath the A domains remain after etching.

Figures 4, 5:
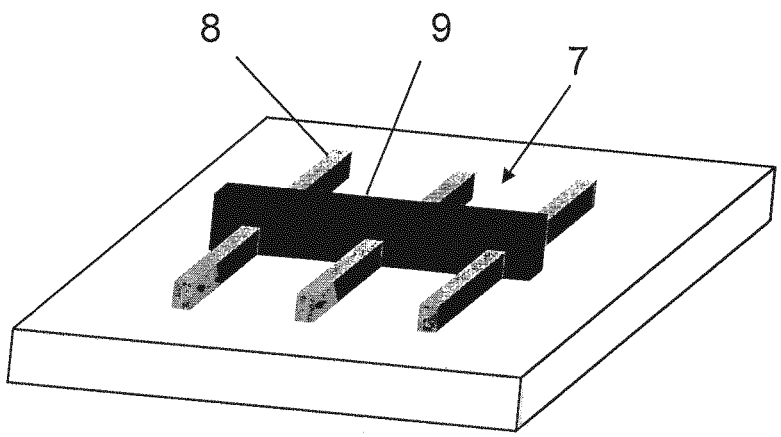
FIG. 4 schematically depicts a FinFET produced in accordance with an embodiment of the invention.
FIG. 5 is a schematic representation of a device having multiple trenches of different widths provided with lithographic features of different pitch.

FIG. 4 shows a particular application of the method in which the lithography features produced in the manner demonstrated in FIGS. 1 to 3 have been used to construct a FinFET 7. The FinFET comprises multiple conducting channels 8 (referred to as fins) wrapped by a gate 9. In this embodiment the lithography features (represented as 6 in FIG. 1) have been used directly as the FinFET conducting channels, and a gate 9 has been placed over the channels to complete the construction of the FinFET.

Although FIG. 4 shows a FinFET having three fins, embodiments of the invention may be used to create FinFETs having other numbers of fins (e.g. two fins, four fins, five fins, six fins, or more). For any given number of fins, the separation between adjacent fins may be selected via appropriate selection of the width of the trench in which the fins are formed (in the manner explained above in relation to FIGS. 2 and 3). The fins may, for example, have a pitch of down to around 20 nm, and may for example have a pitch of down to around 10 nm. The fins may, for example, have a pitch of up to around 40 nm.

FIG. 5 is a schematic representation of a device layout, demonstrating that multiple areas of FinFETs (as represented by (a), (b) and (c)) can be produced on a single device (e.g. an integrated circuit) using a method described herein. Each area of FinFETs may comprise FinFETs having a particular threshold voltage or other property. Thus, for example, areas (a) and (b) may both comprise FinFETs having three fins, but with different fin separations. The threshold voltage for FinFETs in area (a) may therefore be different from the threshold voltage for FinFETs in area (b). Area (c) may for example comprise FinFETs having four fins. The number of fins affects the transistor drive current (ion) strength, and this in turn has an effect on transistor switching characteristics such as switching frequency. The separation of the fins of the FinFETs in area (c) may, for example, be the same as the separation of the fins in area (a), or the separation of the fins in area (b), or may be some other separation.

The device layout shown in FIG. 5 is formed using a single process step (i.e. there is no need to project successive patterns onto the substrate in order to obtain the device layout). In general, an embodiment of the invention allows fabrication of lithographic features having different separations (or pitches) using a single lithographic process of a substrate. An embodiment of the invention allows fine adjustment of the separations (or pitches) of the lithographic features (e.g. as schematically shown in FIGS. 2 and 3).

FIG. 5 and associated description is merely an example. An integrated circuit having a different number of areas of FinFETs may be made using an embodiment of the invention. FinFETs in different areas may have fins with different separations and/or may have different numbers of fins. Additionally, in each area the threshold voltage can be adjusted by changing the separation between gates (in the same way that the separation between fins is used to change the threshold voltage).

EXAMPLES

In order to evaluate the effect of increasing trench width on both row pitch and number of rows, a number of trenches of different widths were experimentally formed.

Silicon wafers were coated with an antireflective coating (layer thickness of 93 nm) and subsequently with resist (layer thickness of 100 nm) before exposure. After a post-exposure bake for 60 seconds at 100° C., the resist was developed using negative tone development to create a pattern of trenches on the wafer. The wafer was then subjected to an additional bake for 10 minutes at 190° C. Negative tone development was used to create resist patterns having good resistance against both annealing temperatures of the BCP and the solvent in which the BCP was dissolved. After the development step a polystyrene-b-methylmethacrylate (PSPMMA) BCP (P2784-SMMA, 37.0-b-16.8, polydispersity index 1.07) (layer thickness outside resist features is 40 nm) was applied via spin coating from a toluene solution (BCP concentration between 0.5 and 2.5 wt %) and the coated layer was dried at 90° C. for 2 min. The wafer was annealed in an oven at around 200° C. for 30 minutes under a nitrogen atmosphere. After the BCP annealing, the wafer was etched on a reactive ion etch tool for 40 seconds, resulting in complete removal of the PMMA phase. Rows of regularly spaced cylindrical phase lithography features lying substantially perpendicular to the substrate were formed in the trenches. The row pitch and number of rows were measured in each case using standard automated metrology scanning electron microscope (SEM), and the results are shown in FIG. 6.

Figure 6:
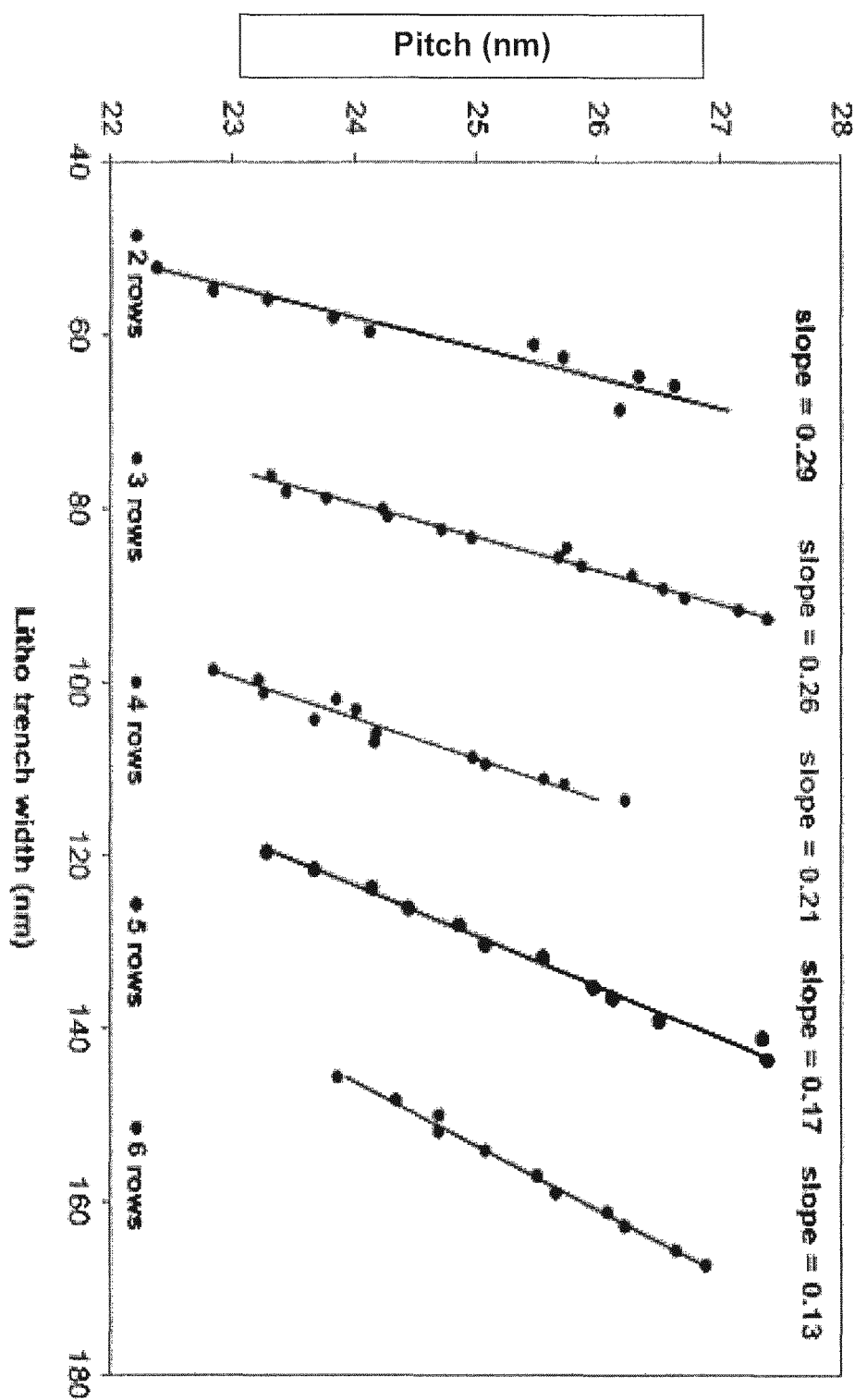
FIG. 6 shows the relationship between trench width and the number of rows and the pitch of features produced in an embodiment of the invention.

FIG. 6 demonstrates that small increases in trench width can cause the row pitch to increase (stretch) up until a point. Still further increases in trench width may then be sufficient to cause the number of domains formed to increase, at which point the pitch of each domain returns to approximately an unstretched state, i.e. the pitch decreases to accommodate the additional domain. For example, and reading from FIG. 6, a trench having a width of approximately 50 to 70 nm will preferentially form an ordered layer having two rows of features; with the pitch of these features ranging from approximately 22 nm to 27 nm (greater pitches corresponding to wider trench widths). A trench having a width of approximately 70 nm to 90 nm, however, will preferentially form an ordered layer having three rows of features; with the pitch of these features ranging from approximately 23 to 28 nm.

It should be noted that, although the lithography features were formed lying substantially perpendicular to the substrate, similar behavior is expected to be observed for features lying substantially perpendicular to the substrate.

Although in the above example the trenches are formed in resist, the trenches may be formed in any suitable material. For example, the trenches may be formed in the substrate (having been transferred from resist into the substrate). Alternatively, the trenches may be formed in a film stack deposited on the substrate surface.

It will be appreciated that aspects of the invention can be implemented in any convenient form. For example, an embodiment of the invention may be implemented by one or more appropriate computer programs which may be carried on appropriate carrier media which may be tangible carrier media (e.g. disks) or intangible carrier media (e.g. communications signals). An aspect of the invention may be implemented using a suitable apparatus which may specifically take the form of programmable computer running a computer program arranged to implement an embodiment of the invention.

The invention claimed is:
1. A method of forming a plurality of regularly spaced lithography features, the method comprising:
   providing a self-assemblable block copolymer having first and second blocks in a plurality of trenches on a substrate, each trench comprising opposing side-walls and a base, with the side-walls having a width therebetween, wherein a first trench has a greater width than a second trench;

causing the self-assemblable block copolymer to self-assemble into an ordered layer in each trench, the layer comprising a first domain of the first block alternating with a second domain of the second block, wherein the first and second trenches have the same number of each respective domain; and selectively removing the first domain to form one or more regularly spaced rows of lithography features comprised of the second domain along each trench, wherein the pitch of the features in the first trench is greater than the pitch of the features in the second trench.

2. The method according to claim 1, wherein the plurality of trenches comprises four or more trenches, wherein the third and fourth trenches have the same number of each respective domain and wherein the second and third trenches have different numbers of each respective domain.

3. The method according to claim 2, wherein the third trench has a greater width than the fourth trench.

4. The method according to claim 1, wherein the one or more rows of regularly spaced lithography features are used to form channels of FETs.

5. The method according to claim 4, wherein the FETs are FinFETs.

6. The method according to claim 1, wherein the lithography features have a pitch of 10 nm or more.

7. The method according to claim 1, wherein the lithography features have a pitch of 40 nm or less.

8. The method according to claim 1, wherein the side-walls are formed using photolithography.

9. The method according to claim 1, wherein the side-walls are sized to have a height of between 20 nm and 150 nm.

10. The method according to claim 1, wherein the trenches have a width of about 200 nm or less.

11. The method according to claim 1, wherein the side-walls have a higher chemical affinity for one of the blocks.

12. The method according to claim 1, wherein the self-assemblable block copolymer is adapted to form a cylindrical ordered layer having first, discontinuous domains of the first block in a cylindrical array alternating with a second continuous domain of the second block therebetween, the domains oriented substantially parallel to the substrate and substantially parallel to the side-walls.

13. The method according to claim 1, wherein the self-assemblable block copolymer is adapted to form a lamellar ordered layer wherein the first domains are lamellae alternating with second domains which are also lamellae, the lamellae of the first and second domains oriented with their planar surfaces lying substantially perpendicular to the substrate and substantially parallel to the side-walls.

14. The method according to claim 1, wherein one of the domains is selectively removed by etching.

15. The method according to claim 1, wherein one of the domains is selectively removed by photo-degradation or photo-cleavage.

16. The method according to claim 1, wherein the trenches are formed in resist.

17. A FinFET formed using the method of claim 1.

* * * * *